United States Patent [19]

Ohhashi et al.

[11] Patent Number: 4,556,815

[45] Date of Patent: Dec. 3, 1985

[54] PIEZOELECTRIC DEVICE FOR DETECTING STOPPAGE OF A NOZZLE

[76] Inventors: Mosaburo Ohhashi, No. 505, 24-55, Takanawa 4-chome, Minato-ku, Tokyo; Hiroshi Yanai, 14, Takatsu-ku, Kawasaki-shi, Kanagawa-ken, both of Japan

[21] Appl. No.: 626,406

[22] Filed: Jun. 29, 1984

[30] Foreign Application Priority Data

Jun. 30, 1983 [JP] Japan ............................... 58-117116

[51] Int. Cl.[4] ......................... H01L 41/08; B05B 1/30

[52] U.S. Cl. .................................... 310/338; 310/319; 310/323; 239/533.15; 239/DIG. 14; 239/DIG. 17

[58] Field of Search ............... 310/323, 339, 328, 319, 310/317, 338; 346/140 PD; 128/194, 207.26, 202.22; 340/618, 623-625; 239/63, 74, 75, 101, 102, 126, 452, 533.1, 533.15, DIG. 14, DIG. 17

[56] References Cited

U.S. PATENT DOCUMENTS

| | | | |
|---|---|---|---|
| 3,387,607 | 6/1968 | Gauthier et al. | 310/335 UX |
| 3,828,773 | 8/1974 | Buch | 310/317 X |
| 3,832,579 | 8/1974 | Arndt | 346/140 PD |
| 3,893,627 | 7/1975 | Siczek | 239/533.15 X |
| 4,123,761 | 10/1978 | Kimura | 346/140 PD |
| 4,300,131 | 11/1981 | Mitsui et al. | 340/618 |
| 4,313,569 | 2/1982 | Burke | 239/533.1 X |

*Primary Examiner*—Mark O. Budd

*Attorney, Agent, or Firm*—Price, Heneveld, Huizenga & Cooper

[57] ABSTRACT

A piezo-electric transducer type pressure sensor such as a silicon pressure sensor or the like is provided in a low path of fluid located in the midway between a valve section and a nozzle ejection port in a fluid ejection gun. When foreign matters in the fluid block the nozzle and hence the ejection from the nozzle becomes an abnormal condition, a fluid pressure variation produced in the flow path between the valve section and the nozzle ejection port is detected in the form of an electric signal by means of the piezo-electric transducer type pressure sensor.

2 Claims, 4 Drawing Figures

PIEZOELECTRIC DEVICE FOR DETECTING STOPPAGE OF A NOZZLE

The present invention relates to a device for automatically detecting stoppage of a nozzle for ejecting liquid.

Generally, in a nozzle to be used for painting or coating, often stoppage would be caused by foreign matters mixing in paint or coating liquid so that it becomes impossible to achieve normal spraying, resulting in defective coating. Therefore, if this stoppage of a nozzle is left in itself, then a large amount of unacceptable products which are unpainted or uncoated would be produced.

One object of the present invention is to provide a device for automatically detecting an abnormal condition or a nozzle in the event that the above-described foreign matters have blocked tha nozzle.

Another object of the present invention is to prevent production of unacceptable products caused by spraying under an abnormal condition where foreign matters have blocked a nozzle.

Still another object of the present invention is to detected stoppage of a nozzle caused by foreign matter, in a reliable manner and at a fast response speed.

Yet another object of the present invention is to avoid large-sizing of an ejection gun for liquid provided with the above-mentioned detecting device.

In order to achieve the above-described objects, on the basis of the recognization that in a middle portion between a valve section and a nozzle ejection port within an ejection gun a remarkable pressure difference would arise between a normal spraying condition and an abnormal condition where the nozzle is blocked, one feature of the present invention resides in that a pressure sensor of piezo-electric transducer type is provided in the proximity of and upstream of the nozzle ejection port.

Figure 1:
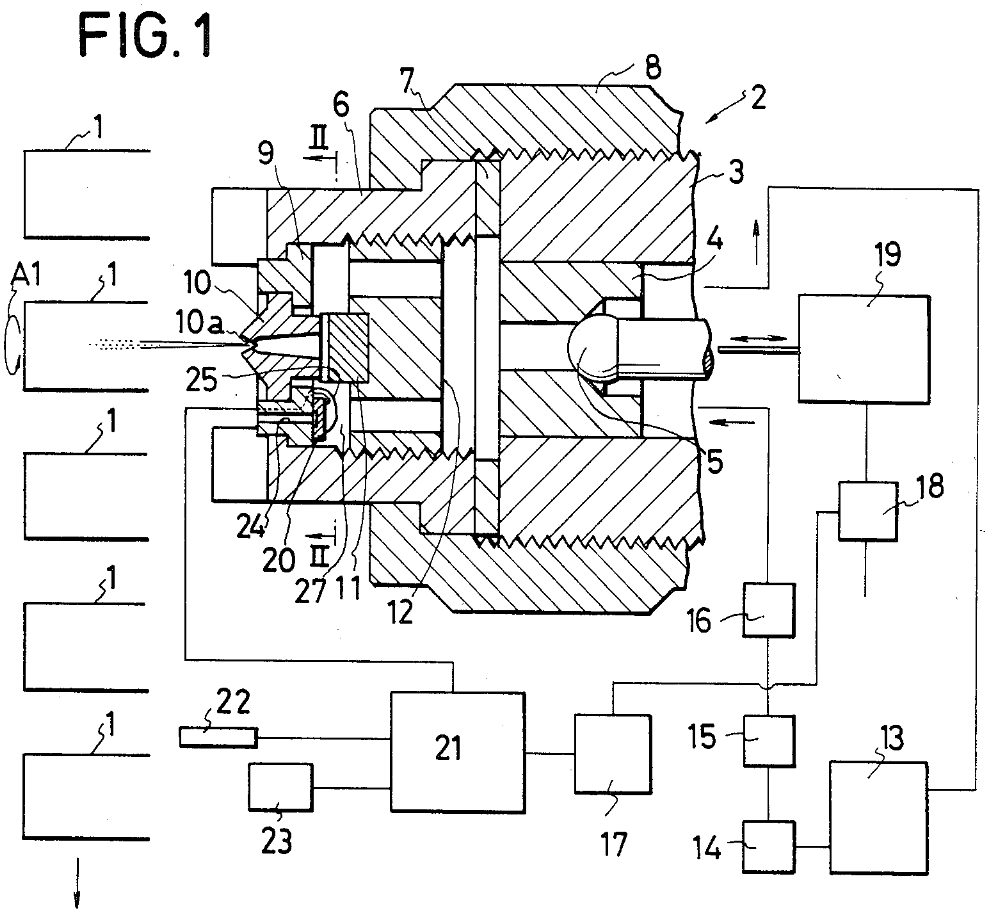
Figure 2:
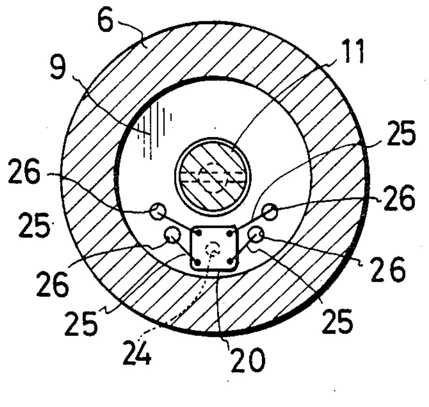
Figure 3:
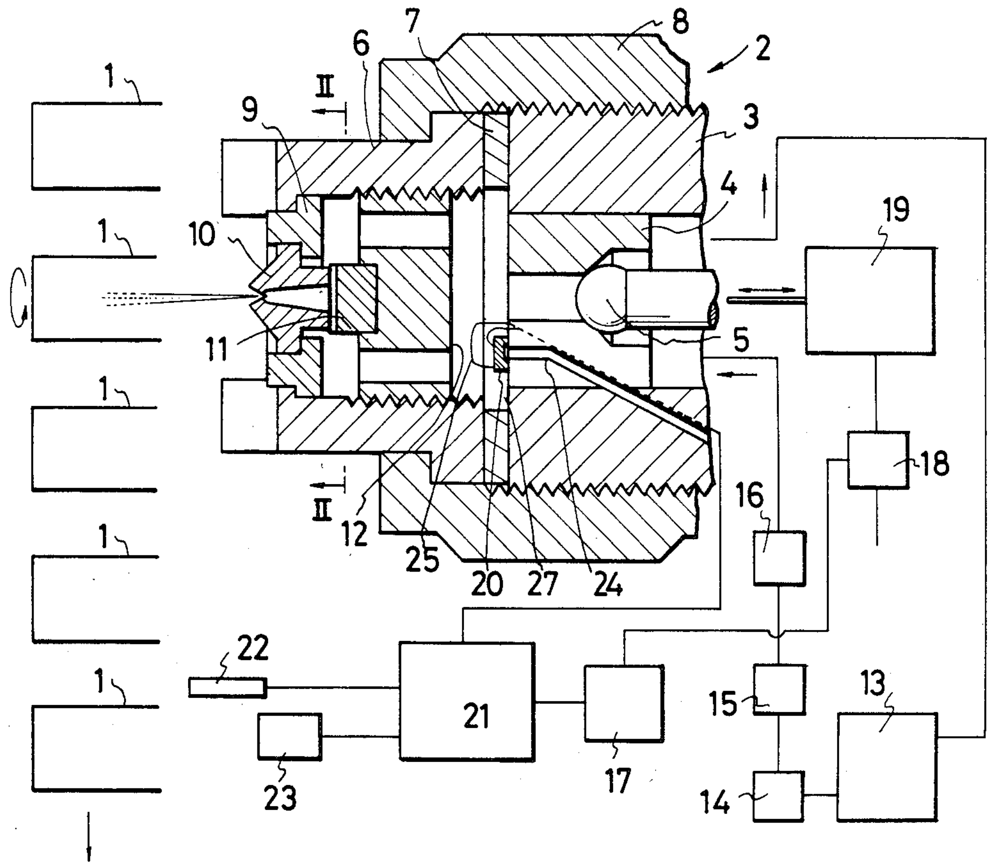
Figure 4:
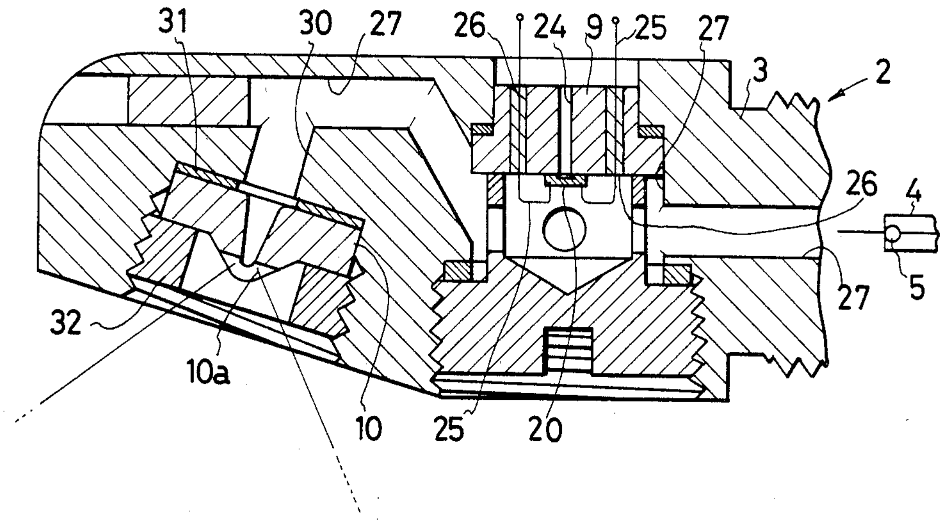

The above-mentioned and other objects and features of the present invention will be understood in more detail from the following description of the invention taken in conjunction with the accompanying drawings, wherein:

FIG. 1 is a longitudinal cross-section view of a device according to the present invention combined with a system diagram showing an operating condition of the device, FIG. 2 is a transverse cross-section view taken along line II—II in FIG. 1, FIG. 3 is a longitudinal cross-section view and a system diagram in combination similar to FIG. 1 of a modified embodiment of the present invention, and FIG. 4 is a partial longitudinal cross-section view of a further modified embodiment of the present invention.

Referring now to FIGS. 1 and 2 which show one example of a detecting device according to the present invention as equipped in a coating apparatus for inner surfaces of cans, the construction is such that in the midway of successive transfer of cans while being revolved in the direction of arrows A1, coating liquid can be timely sprayed into the cans by means of an ejection gun 2. With regard to a spray gun serving as the ejection gun 2, a valve seat 4 is fixedly secured to a portion of a gun main body 3 near to its tip end, a valve body 5 is opposed to the valve seat 4 on its back side as biased to normally close the valve seat 4, and at the tip end of the gun main body 3 is mounted a holder 6 via packing 7 by means of a top nut 8. To this holder 6 is fixedly secured in a liquid-tight condition an orifice type flat ejection nozzle tip 10 via a support 9, and on the back side of the nozzle tip 10 is provided, if desired, a grooved disturbance plate 11 in a press-contact condition by threadedly inserting a mounting member 12. Coating liquid which circulates from a coating liquid supply source 13 through a heater 14, a filter 15 and a pressure regulator 16, is introduced to the back side of the valve seat 4 always under a constant pressure, and further, opening and closing operations of the valve body 5 is actuated by a hydraulic actuator 19 which is advanced and retracted at a fixed period according to opening and closing of a solenoid valve 18 which is in turn operated by a timer 17 at the timing corresponding to the transfer speed of the above-described articles 1. Accordingly, by periodically retracting the valve body 5 by means of the actuator 19, the coating liquid is sprayed in a sector shape from an ejection port 10*a* of the nozzle tip 10 through the valve seat 4, the mounting member 12, the disturbance plate 11 and the nozzle tip 10, and thereby the articles 1 which are being transferred can be successively subjected to coating.

The above-described structure is not different in essence from that of a coating apparatus of such type in the prior art. However, according to an essential feature of the present invention, a piezo-electric transducer type pressure sensor 20 is fixedly mounted at a location between the valve section consisting of the valve seat 4 and the valve body 5 and the ejection port 10*a* of the nozzle tip 10, for instance, on the inside of the support 9, and this pressure sensor 20 is electrically connected to a control device 21 so as to transmit a pressure variation to the control device 21 in the from of an electric signal. The pressure detected by the pressure sensor 20 repeats variations between high and low levels in the shape of pulse waveforms according to the opening and closing cycles of the valve section under a normal spraying condition, whereas under an abnormal condition where stoppage due to forein matters has occurred at the ejection port 10*a* of the nozzle tip 10, the supply pressure of the coating liquid is in itself applied to the pressure sensor 20 regardless of whether the valve section is opening or closing. Therefore, if such a pressure detection signal under an abnormal condition is applied to the control device 21, then according to an instruction from the control device 21 the solenoid valve 18 is stopped in a closing condition via the above-described timer 17 to hold the valve section in a closing condition, at the same time a stopper 22 adapted to operate according to an instruction from the control device 21 is projected so as to be adapted for stopping of transfer of the articles 1, and also an alarm 23 adapted to operate according to an instruction from the control device 21 is actuated to generate an alarm sound.

While various type of sensors can be employed for the above-described pressure sensor 20, in the illustrated embodiment it is preferable to use the so-called silicon pressure sensor, which is manufactured through a similar process to the manufacturing process of IC's and is known as a diffusion type semiconductor pressure sensor. In this silicon pressure sensor, silicon is used for a pressure-sensitive diaphragm, gauge sections are integrally produced through a diffusion process at predetermined central portion and peritheral portion and a bridge circuit including the gauge sections is formed as an integrated circuit. In view of the fact that this pressure sensor is small-sized and has a square plate shape of several millimeters in edge length, it is suitable to be provided in a coating liquid flow path near to the nozzle tip 10. This pressure sensor 20 is fixedly secured in a liquid-tight manner to the portion of the support 9 corresponding to a ventilation hole 24 therein by means of a glass binder, from lead wires 25 of the sensor 20 are led out externally through holes 26 drilled in the support 9, and thereafter the holes 26 are closed by glass-seal to finish the mounting. The support 9 should be preferably made of a material having a nearly equal coefficient of thermal expansion to that of the silicon diagram and glass, for example, Kovar.

In a modified embodiment shown in FIG. 3, a pressure sensor 20 is fixedly mounted to a portion of a valve seat 4 faced to a coating liquid flow path 27, and lead wires 25 connected to the pressure sensor 20 are passed through the valve seat 4 and a gun main body 3 to be led out externally at their opposite ends. The other structure is the same as that of the first embodiment shown in FIGS. 1 and 2, and component parts designated by like reference numerals in the drawings are also identical with respect to their functions to those of the first embodiment.

In the structure for mounting a nozzle tip 10 in a further modified embodiment shown in FIG. 4, a receiving hole 30 is provided at the tip end of a gun main body 3, a nozzle tip 10 is inserted into this hole 30 with a packing 31 interposed at the bottom and is fixedly secured by threadedly inserting a mounting member 32 from the outside. Accordingly, it is possible to supply the pressurized liquid, which is fed through a valve section consisting of a valve seat 4 and a valve main body 5, through a flow path 27 to the nozzle tip 10, and to spray it from as ejection port 10*a* of the nozzle tip 10, and moreover, it is also possible to detect a pressure variation in the flow path 27 between the valve section and the nozzle port 10*a* as an electric signal variation by means of the pressure sensor 20. It is to be noted that in FIG. 4, component parts designated by like reference numerals as also identical with respect to functions to those of the first embodiment shown in FIGS. 1 and 2.

In the first embodiment illustrated in FIG. 1, description has been made with respect to the case where the articles 1 to be coated are cans being successively transferred. However, the present invention is not limited to such a case of intermittent spraying, but it is equally applicable to the case of continuous spraying. In more particular, in the case of continuous spraying, the pressure at a point near to and upstream of the nozzle tip 10 is lowered by several percents or more with respect to the supply pressure at an upstream point of the valve section in view of the fact that the fluid is being ejected through the ejection port. Accordingly, the detected pressure under a normal spraying condition is lowered by several precents with respect to the supply pressure, whereas the detected pressure under an abnormal condition where stoppage caused by foreign matters has occured in the nozzle, the supply pressure in itself is detected as the detected pressure, and so, the stoppage of the nozzle can be detected reliably.

As described above, according to the present invention, since provision is made such that a pressure at an intermediate location between a valve section and a nozzle ejection port can be obtained in the form of an electric signal by means of a piezo-electric transducer type pressure sensor, there is provided an effect that on the basis of the electric signal, stoppage of the nozzle can be detected reliably and at a reduced response time, furthermore there is an advantage that the pressure sensor can be mounted so as to be cantained within a nozzle portion near to the tip end of an ejection gun substantially without increasing the occupation volume of the nozzle portion, accrodingly the ejection gun itself is not large-sized, and hence the place for painting or coating is not restricted.

What is claimed is:

1. In combination a discharge head having a discharge nozzle for pressurized fluids and a shut-off valve and means for controlling the actuation of the shut-off valve; said discharge nozzle having a discharge port; a fluid flow path through said discharge head including a fluid inlet conduit and a chamber communicating with said conduit and a fluid passage communicating with both said chamber and the discharge port of said discharge nozzle; said chamber being in a portion of said fluid flow path where the pressure of said fluid when the discharge nozzle is operating normally is less than that at which the fluid is delivered to said discharge head; said shut-off valve being seated in said conduit and actuator means holding said shut-off valve in normally open position; a piezo-electric transducer type pressure sensor seated in and exposed to the fluid in said chamber; signal transmission means interconnecting said sensor with said actuator means for actuating said actuator means to close said shut-off valve upon detection by the sensor of an increase of fluid pressure of the type characteristic of a blockage of fluid flow through the nozzle.

2. The combination described in claim 1 wherein an alarm is provided; means connecting said alarm to said signal transmission means for actuating said alarm simultaneously with the closing of said shut-off valve.

* * * * *